(12) United States Patent
Webb

(10) Patent No.: US 7,345,353 B2
(45) Date of Patent: Mar. 18, 2008

(54) SILICON CARRIER HAVING INCREASED FLEXIBILITY

(75) Inventor: Bucknell C. Webb, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/323,568

(22) Filed: Dec. 30, 2005

(65) Prior Publication Data
US 2007/0152346 A1 Jul. 5, 2007

(51) Int. Cl.
*H01L 23/58* (2006.01)

(52) U.S. Cl. .................. 257/594; 257/618; 257/622

(58) Field of Classification Search ............... 257/778, 257/594, 618, 622
See application file for complete search history.

(56) References Cited

U.S. PATENT DOCUMENTS

| | | | |
|---|---|---|---|
| 6,274,929 B1 * | 8/2001 | Leong et al. ............... 257/724 |
| 6,294,840 B1 * | 9/2001 | McCormick ............... 257/778 |
| 6,437,990 B1 * | 8/2002 | Degani et al. ............. 361/783 |
| 6,849,843 B2 * | 2/2005 | Ansorge et al. .......... 250/208.1 |
| 6,946,743 B2 | 9/2005 | Silverbrook |
| 2002/0050403 A1 | 5/2002 | Yasukawa |
| 2002/0079575 A1 | 6/2002 | Hozoji |
| 2005/0130383 A1 * | 6/2005 | Divakaruni et al. ........ 438/384 |
| 2005/0189644 A1 | 9/2005 | Ho |
| 2005/0285246 A1 * | 12/2005 | Haba et al. ................ 257/678 |
| 2006/0079072 A1 * | 4/2006 | David et al. ............... 438/460 |

FOREIGN PATENT DOCUMENTS

EP  1 351 299 A  10/2003
JP  2002029891 A * 1/2002

OTHER PUBLICATIONS

Knickerbocker, J. U. et al., Development of next-generation technology based on silicon carriers with fine-pitch chip interconnection, IBM J. Res. & Dev., 725-53, Jun. 2005.
Search Report on PCT Application No. PCT/EP2006/069774.
Knickerbocker et al, Development of Next-Generation System-On-Package (SOP) technology based on silicon carriers with fine-pitch chip interconnection, IBM J. Res. & Dev. vol. 49, No. 4/5 Jul./Sep. 2005.

* cited by examiner

*Primary Examiner*—Wai-Sing Louie
(74) *Attorney, Agent, or Firm*—Ference & Associates LLC

(57) ABSTRACT

An apparatus and method providing flexibility to a silicon chip carrier which, in at least one embodiment, comprises multiple chips and a silicon chip carrier having thinned regions between some adjacent chips, thus, allowing for increased flexibility and reduced package warpage.

18 Claims, 3 Drawing Sheets

Flexchip Model (MPa)

SILICON CARRIER HAVING INCREASED FLEXIBILITY

FIELD OF THE INVENTION

The present invention relates generally to packaging technology for electronic components, and more particularly relates to the field of silicon based carriers for microelectronics.

BACKGROUND OF THE INVENTION

Silicon based packages are known to have significant potential affect upon packaging technology. As explained in Development of Next-Generation System-On-Package (SOP) technology Based on Silicon Carriers with Fine-Pitch Chip Interconnection, Knickerbocker et al., IBM J. Res. & Dev. Vol. 49, No. 4/5 July/September 2005, which is hereby incorporated by reference, some useful features of silicon based packages include: dense wiring using back-end-of-line (BEOL) processing; increased chip package interface reliability; the use of interconnections like advanced solder microbumps or permanent copper interconnections; the ability to embed active devices into the carrier itself; and for carriers having through-vias the support of heterogeneous semiconductor technologies, passive or active circuits and high-density I/O wiring interconnections with electro-optic technology, as well as the support of three-dimensional circuit integration.

The full potential of silicon carriers cannot be fully realized, however, until problems related to thermal mismatches between various components of silicon based packages are overcome. Broadly speaking, a silicon based package is comprised of various components including, chips, carriers having various bumps and underfills, and substrates, all of which may be made of the same or different materials and have different thermal and mechanical stresses placed upon them. For a more in-depth discussion of silicon based packages, any of several sources may be relied upon, including G. W. Doerre and D. E. Lackey, "The IBM ASIC/SoC Methodology—A Recipe for First-Time Success," IBM J. Res. & Dev. 46, 649 (2002), and D. J. Bodendorf, K. T. Olson, J. P. Trinko, and J. R. Winnard, "Active Silicon Chip Carrier," IBM Tech. Disclosure Bull. 7, 656 (1972).

For example, the useable size of a chip can be limited by the thermal mismatch between a silicon chip and substrate. If a chip is too large, the stresses at the largest distances from the thermal neutral point on the underfill, solder balls, and chip can exceed the material strengths and cause failures and/or material fatigue, and/or package warpage such that the useable limits for attachment or cooling solutions are exceeded. There is a similar issue with silicon carriers where multiple chips are attached to a silicon carrier interposer which is added between the chips and package or circuit board. A silicon carrier can be made thinner to increase its flexibility; however, this limits the robustness of the carrier relative to the forces placed on it during bonding and thermal cycling due to the bumps above and below the carrier which exert loads on the carrier.

A need has therefore been recognized in connection with providing an effective means for reducing the thermo-mechanical stresses created by thermal mismatches between chip, carrier, and substrate.

SUMMARY OF THE INVENTION

There is broadly contemplated, in accordance with at least one presently preferred embodiment of the present invention, an apparatus providing reduced thermal-mechanical stresses to a silicon carrier through the creation of localized regions in which the silicon carrier is thinned.

In accordance with one embodiment of the present invention, an apparatus providing reduced thermal-mechanical stresses to an electronic device is provided, the apparatus comprising a plurality of chips electrically connectable to a silicon chip carrier having thinned regions between adjacent chips, wherein the silicon chip carrier includes bumps and underfill. The thickness of said silicon carrier is reduced locally, for example in the parts of the carrier where chips are not attached, to introduce greater flexibility where the loads due to bumps are not present. The silicon carrier can be of varied thickness and, thus, rigid where bumps are located and flexible in other locations where bumps are not present.

In summary, one aspect of the invention provides a chip carrying apparatus for use in electronic devices, said apparatus comprising: a plurality of chips; a chip carrier including interconnection regions allowing electrical interconnections between chips and chip carrier, wherein said localized areas of said chip carrier are thinned; and a substrate.

For a better understanding of the present invention, together with other and further features and advantages thereof, reference is made to the following description, taken in conjunction with the accompanying drawings, and the scope of the invention will be pointed out in the appended claims.

DESCRIPTION OF THE PREFERRED EMBODIMENTS

Figure 1:
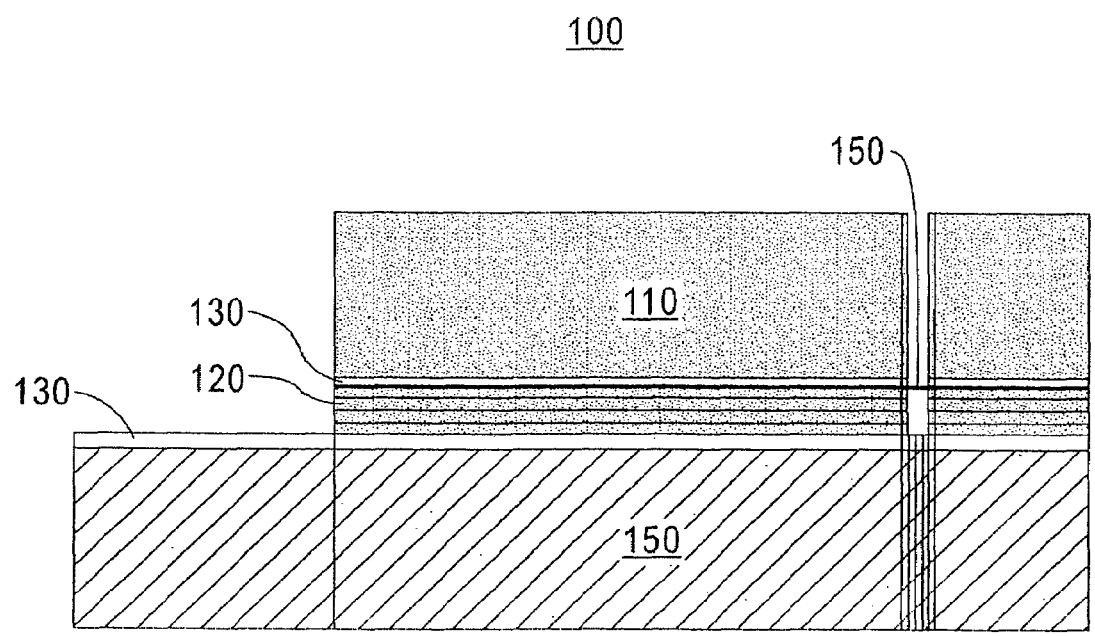
FIG. 1 schematically illustrates a silicon carrier in accordance with at least one embodiment of the present invention, including a locally thinned region of the silicon carrier.

Referring to the drawings, in FIG. 1 a silicon-carrier-based package 100 is shown in accordance with a presently preferred embodiment of the invention. The silicon-based package 100 includes: chips 110; a silicon carrier 120; bumps and underfill 130 associated with the top and bottom of the silicon carrier 120; substrate 140; and a localized thinned region 150 of the silicon carrier 120. In this embodiment it is preferred the substrate 140 is 1 mm thick $Al_2O_3$, the silicon carrier is 200 µm thick, and the chips are 720 µm thick and 5 mm wide. While the presently preferred dimensions are set forth in the preceding sentence, any appropriate thickness may be used. It should be recognized, however, that wafer thickness standard is about 700 um, the silicon carrier thickness is likely to be 25 um to 300 um, and the present invention may not be especially useful if the silicon carrier thickness is below about 20 um as the structure is then very flexible anyway. In any event, it is unlikely the thinness can go below 5 um-10 um as this is about what the wiring thickness is.

Figure 2:
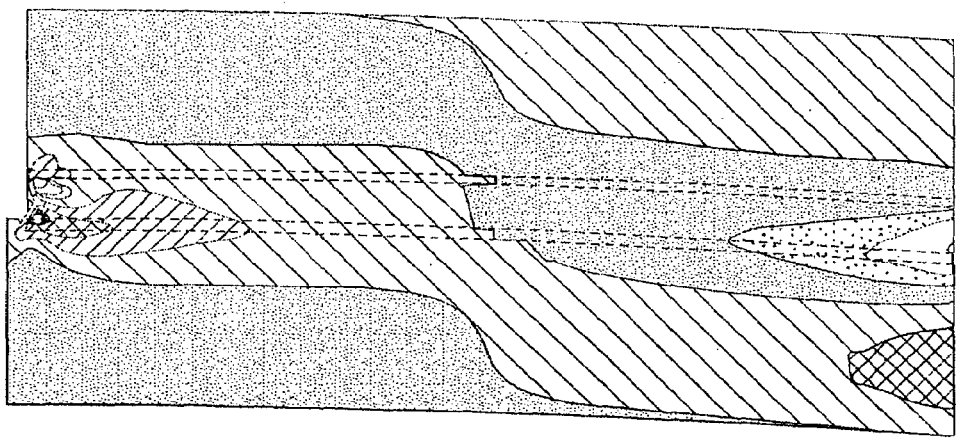
FIG. 2 schematically illustrates the thermal mismatch induced bending and shear stress for the right side of the structure illustrated in FIG. 1.
Figure 2:
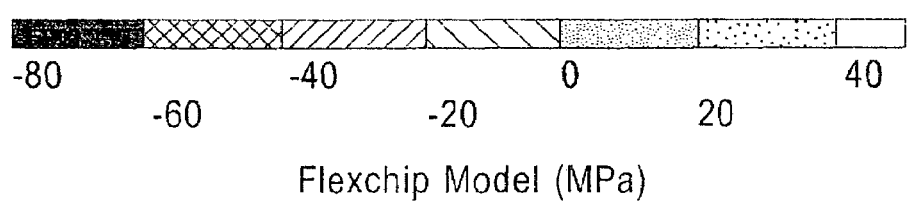
Figure 3:
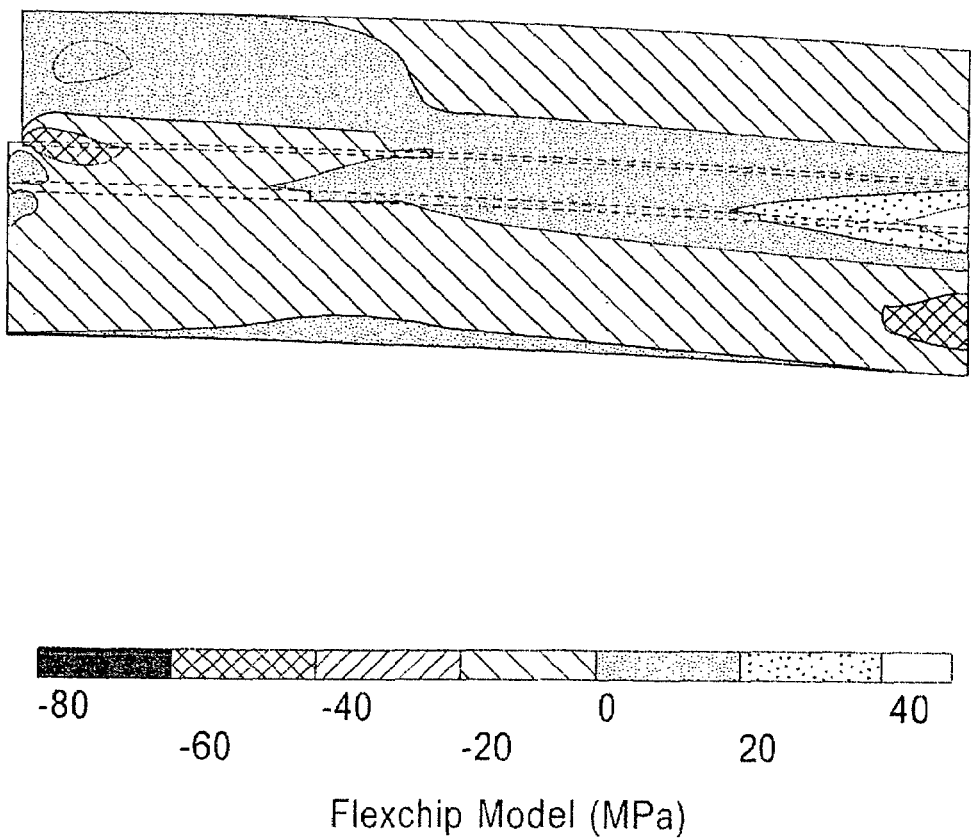
FIG. 3 schematically illustrates the thermal mismatch induced bending and shear stress for the right side of a structure equivalent to that as shown in FIG. 1 except that no region of the silicon carrier is thinned.

FIG. 2 provides a measure of the of the thermal mismatch induced bending and shear stress on the right side of the silicon-based package 100 when the temperature is reduced from a stress free state at 100° C. to 25° C. As recognized by one of skill in the art, the value 100C is about the midpoint between solder solidification and room temperature and is thus roughly about the stress free point after multiple temperature cycles. The range is fairly typical of a chip-on chip-off temperature cycle although wider ranges are required for reliability testing. (For illustrative purposes the bending is exaggerated by a factor of 5.) The bending for the silicon-based package 100 having a thinned region 150, as shown in FIG. 2, is equal to −23 μm at midpoint deflection off chord. In comparison, FIG. 3 provides a measure of the thermal mismatch induced bending and shear stress on the right side of the silicon-based package 100 where the temperature is again reduced from 100° C. to 25° C. but where the silicon carrier does not have any thinned silicon regions. The bending for the silicon-based package 100 without a thinned region 150, as shown in FIG. 3, is equal to −31 μm.

Thus, it should be appreciated that a silicon carrier 120 having a thinned region 150 is more flexible allowing for increased bending to occur, thereby reducing package warpage, as compared to a silicon carrier 120 having no thinned regions, i.e, the thinned regions of the silicon carrier 120, having increased flexibility, provide increased stability to the silicon carrier 120, as well as the entire silicon based package 100. Thus, the use of the locally thinned silicon carrier apparatus as described in at least one of the presently preferred embodiments reduces the negative effects of thermal mismatch, package warpage, and overall package failure. It should also be noted, however, that the carrier thickness and substrate composition will impact the desirability of thinning. Thus, for example, where a carrier is already relatively thin further thinning may not be advantageous. In one preferred embodiment, the silicon of the carrier is removed entirely in the thinned regions, so the remaining carrier is made up of only the wiring layer or layers, generally consisting of silicon dioxide and copper or other conducting metals. Since a significant increase in carrier flexibility is required for thinning to be useful, the preferred embodiment contemplates thinning by at least a factor of 0.6 which would reduce the carrier stiffness by about a factor of two.

As appreciated by one skilled in the art, the apparatus of the present invention can be constructed using a subset of, and coincident with, process steps used to make silicon through a number of different processes. A preferred process comprises: (a) patterning and DRIE etch to etches holes or grooves for the through-via walls, wherein the etching of the walls of the regions where the silicon carrier is to be locally thinned can also be achieved; (b) thermal oxide and CVD polysilicon fill of grooves; (c) completion of all front end line processes (FEOL) including devices (d) metal or other material being used for the etch stop; however, it should be noted that unlike the through-via process, the etch stop does not require electrical conduction or connection; (e) back-end-of-line (BEOL) pads, wiring and insulation, wherein these layers can remain in the flexible regions (generally BEOL and wiring layers are thin enough to sustain the contemplated bending of the present invention); (f) lamination to support glass and carrier thinning; (g) backside patterning to expose via cores and regions to be further thinned; and (h) wet chemical etch to remove via cores and regions to be thinned. (i) any further process steps related to finishing the carrier.

If not otherwise stated herein, it is to be assumed that all patents, patent applications, patent publications and other publications (including web-based publications) mentioned and cited herein are hereby fully incorporated by reference herein as if set forth in their entirety herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A chip carrying apparatus for use in electronic devices, said apparatus comprising:
   a plurality of chips;
   a silicon chip carrier including interconnection regions allowing electrical interconnections between said chips and said silicon chip carrier; and
   a substrate;
   wherein the thickness of at least one localized area of said silicon chip carrier between two or more of said chips is reduced compared to at least one other localized area of said silicon chip carrier;
   wherein the thickness of the at least one localized area is reduced to no more than about sixty percent of the at least one other localized area;
   wherein said reduced area comprises a BEOL layer.

2. The apparatus according to claim 1, wherein said interconnections are solder microbumps.

3. The apparatus according to claim 1, wherein said interconnections are permanent copper interconnections.

4. The apparatus according to claim 1, wherein said silicon chip carrier further comprises through-vias.

5. The apparatus according to claim 1, wherein the thickness of any wiring layers is not reduced.

6. The apparatus according to claim 1, wherein walls to said reduced areas are formed by etching.

7. The apparatus according to claim 6 wherein said reduced areas are formed by a chemical etching process.

8. The apparatus according to claim 6, wherein said etching comprises DRIE etching.

9. A method for manufacturing a chip carrying apparatus for use in electronic devices, said method comprising the steps of:
   creating interconnection regions in a silicon chip carrier which allow electrical interconnections between said silicon chip carrier and chips placed on said silicon chip carrier;
   reducing the thickness of at least one localized area of said silicon chip carrier between two or more of said chips compared to at least one other localized area of said silicon chip carrier;
   wherein the thickness of the at least one localized area is reduced to no more than about sixty percent of the at least one other localized area;
   wherein said reduced region comprises a BEOL layer.

10. The method according to claim 9, wherein said interconnections are solder micobumps.

11. The method according to claim 9, wherein said interconnections are permanent copper interconnections.

12. The method according to claim 9, wherein said silicon chip carrier comprises through-vias.

13. The method according to claim 9, wherein the thickness of any wiring layers is not reduced.

14. The method according to claim 9, wherein walls to said reduced areas are formed by etching.

15. The method according to claim 14, wherein said reduced areas are formed by a chemical etching process.

16. The method according to claim 14, wherein said etching comprises DRIE etching.

17. The apparatus according to claim 1, wherein the thickness of said chip carrier is substantially eliminated in at least one of said reduced areas.

18. The method according to claim 9, wherein the thickness of said chip carrier is substantially eliminated in at least one of said reduced areas.

* * * * *